United States Patent [19]

Kazufumi et al.

[11] Patent Number: 4,523,102

[45] Date of Patent: Jun. 11, 1985

[54] SOLID-STATE COLOR-IMAGE SENSOR AND PROCESS FOR FABRICATING THE SAME

[75] Inventors: Ogawa Kazufumi; Shigeru Kondo; Yoshiko Yasuda; Taketoshi Yonezawa, all of Osaka; Isamu Kitahiro, Kyoto, all of Japan

[73] Assignee: Matsushita Electric Industrial Co., Ltd., Osaka, Japan

[21] Appl. No.: 462,396

[22] Filed: Jan. 31, 1983

Related U.S. Application Data

[62] Division of Ser. No. 242,578, Mar. 11, 1981, Pat. No. 4,388,128.

[30] Foreign Application Priority Data

Mar. 17, 1980 [JP] Japan ................................. 55-33805
Mar. 18, 1980 [JP] Japan ................................. 55-4857
Mar. 19, 1980 [JP] Japan ................................. 55-35291

[51] Int. Cl.³ ........................................... H01J 40/14
[52] U.S. Cl. .................................... 250/578; 428/419; 156/275.5; 156/273.5; 204/159.15
[58] Field of Search ................. 204/159.15, 159.20; 156/275.5, 273.5; 250/211 R, 578, 226; 428/419; 430/321, 311, 312, 313; 357/31; 358/213, 212, 48, 49

[56] References Cited

U.S. PATENT DOCUMENTS

| 3,644,161 | 2/1972 | Hall | 156/273.5 |
| 3,697,395 | 10/1972 | Kehr et al. | 204/159.15 |
| 3,697,396 | 10/1972 | Kehr et al. | 204/159.15 |
| 4,345,021 | 8/1982 | Ogawa et al. | 250/578 |
| 4,411,980 | 10/1983 | Haney et al. | 430/311 |
| 4,447,720 | 5/1984 | Ogawa et al. | 250/578 |

*Primary Examiner*—David C. Nelms
*Assistant Examiner*—Jon Brophy
*Attorney, Agent, or Firm*—Burgess, Ryan & Wayne

[57] ABSTRACT

In a step for bonding a color filter to a solid-state color-image sensor chip with an adhesive which is curable not only by light or more particularly ultraviolet-ray irradiation but also by heating, pre-curing or partial curing is effected by irradiating light rays after the color filter and the chip has been pressed against each other and correctly aligned with each other in a bonding device and then the chip with the partially-bonded color filter is removed from the bonding device and complete curing of the adhesive is accomplished by heating. According to one embodiment of the present invention the bonding step is carried out in an atmosphere containing the oxygen so that the adhesive which has been squeezed out from the space between the color filter and the chip may be prevented from being cured and subsequently removed in a simple manner. According to a further embodiment of the present invention, prior to the bonding step, the color filter and chip are covered with protective layers or films so that surface flaws may be avoided. Thus, the color filters can be bonded to the chips with a higher degree of accuracy and a higher degree of adhesive strength and the mass production of solid-state color-image sensors can be much facilitated.

10 Claims, 32 Drawing Figures

SOLID-STATE COLOR-IMAGE SENSOR AND PROCESS FOR FABRICATING THE SAME

This is a division of application Ser. No. 242,578, filed Mar. 11, 1981 now U.S. Pat. No. 4,388,128.

BACKGROUND OF THE INVENTION

The present invention relates to generally a process for fabricating solid-state color-image sensors and more particularly a step for bonding to a CCD or BBD color-image sensor chip; that is, a chip bearing a CCD or BBD color-image sensor a color filter having a stripe or mosaic pattern in such a way that the picture-element grid on the chip may be correctly aligned with the stripe or mosaic pattern on the color filter.

Extensive developments of solid-state color-image sensors have raised great expectations in making video cameras compact in size and light in weight. In the case of color video cameras of the type using a single-plate color-image sensor, the color-image sensor must be provided with a three-color filter (for consisting of red, green and cyan blue stripes or mosaic elements) which must be correctly aligned with a picture-element grid on a chip. In general, the color filters are fabricated separately from the color-image chips and comprise an optical glass substrate and a colored pattern layer or a filter pattern which is formed on one major surface of the substrate by coating or depositing colored organic compounds. The color filter is bonded to the color-image sensor chip with a suitable adhesive. A higher degree of adhesive strength may be ensured with the use of an adhesive which is curable by heating and is widely used in cementing optical lenses.

Meanwhile, in order to make the color video cameras more compact in size and lighter in weight, the surface areas of solid-state color-image sensors must be reduced without sacrificing the resolution and the sensitivity to light. For this purpose, spacing between picture elements must be reduced and the colored pattern layer or filter pattern on a color filter must be aligned with the picture-element grid on a chip with a higher degree of accuracy. However, the results of extensive studies and experiments conducted by the inventors that with the conventional thermosetting adhesives, the color filters cannot be bonded to the color-image sensor chips with a desired degree of accuracy in alignment.

For instance, a color filter and a color-image sensor chip each having a bonding surface of 200 mm$^2$ must be bonded together with an adhesive layer less than 10 μm in thickness and with an alignment accuracy of less than 2 μm, the alignment accuracy referring to an accuracy in alignment between individual picture elements on the chip with their corresponding color filter elements on the color filter. For this purpose, it is imperative to simultaneously carry out the step for pressing the color filter and the color-image sensor chip against each other and the step for attaining the correct alignment between them.

However, with the conventional thermosetting adhesives, curing or setting proceeds very gradually when the adhesive layer is less than 10 μm. As a result, the color filter and the color-image sensor chip cannot be aligned smoothly. Furthermore, when a curing time is considerably longer than an alignment time; that is, a time interval required for attaining the alignment between the color filter and the chip, a long time passes before the chip with the cemented color filter can be removed out of a curing and aligning device. As a result, the mass production of solid-state color-image sensors cannot attain its inherited advantages. Furthermore, there has been a drawback that during a curing time after the alignment step, misalignments tend to occur very frequently. As a result, the signal-to-noise ratio is degraded and color flicker occurs. In the worst case, color misregistration results.

In view of the above, an adhesive used to bond color filters to color-image sensor chips must have such a characteristic that it will not be cured during the alignment step, but will be quickly cured after the alignment. Therefore, it is preferable to use an adhesive of the type which is cured when irradiated by light rays and especially by ultraviolet rays because a cured adhesive layer has a higher degree of transparency. However, it had been found out that adhesives which are curable by ultraviolet-ray irradiation are not satisfactory in practice as will be described in detail with reference to the accompanying drawings.

SUMMARY OF THE INVENTION

In view of the above, a first purpose of the present invention is to provide a step for bonding or cementing a color filter to a color-image sensor chip which step is characterized in that after the alignment of the color filter with the color-image sensor chip, an adhesive is partially cured by ultraviolet-ray irradiation and the adhesive immediately below the filter pattern and light-shielding layers or light guard bands surrounding the filter pattern is then cured by heating after the chip has been removed from an ultraviolet-ray curing equipment.

A second purpose of the present invention is to provide a step for irradiating an adhesive with light rays in an atmosphere containing the oxygen, thereby curing only the adhesive 14 sandwiched between a color filter 1 and the picture-element grid 6 on a color-image sensor chip but preventing the adhesive squeezed out of the color filter 1 from being cured.

A third purpose of the present invention is to provide a process for mass-producing high-precision and high-quality solid-state color-image sensors by forming a protective layer over the surface of a color filter, thereby preventing surface flaws due to dust or other foreign matters.

The present invention, therefore, provides a process for fabricating solid-state color-image sensors and more particularly a step for bonding a color filter to a solid-state color-image sensor chip with an adhesive which is curable not only by light irradiation but also by heating in such a way that after the color filter and chip are pressed against each other and correctly aligned, the adhesive is partially cured with light irradiation and then completely cured by heating after the chip with the partially bonded color filter has been removed out of an alignment equipment.

According to one embodiment of the present invention, a curing step is carried out in an atmosphere containing the oxygen so that the adhesive which has been squeezed out when a color filter and a color-image sensor chip were pressed against each other may be prevented from being cured and consequently easily removed.

According to another embodiment of the present invention, prior to the bonding step, color filters and color-image sensor chips are covered with protective coatings or films so that surface flaws due to bonding may be eliminated.

Thus according to the present invention, the mass production of high-precision and high-quality solid-state color-image sensors at a high yield becomes possible.

The above and other purposes, effects and features of the present invention will become more apparent from the following description of preferred embodiments thereof taken in conjunction with the accompanying drawings.

BRIEF DESCRIPTION OF THE DRAWINGS

FIG. 4A showing the color filter and chip before the color filter is pressed against the chip and FIG. 4B showing the color filter bonded to the chip;

DESCRIPTION OF THE PRIOR ART

Figures 1A, 1B, 1C, 2A:
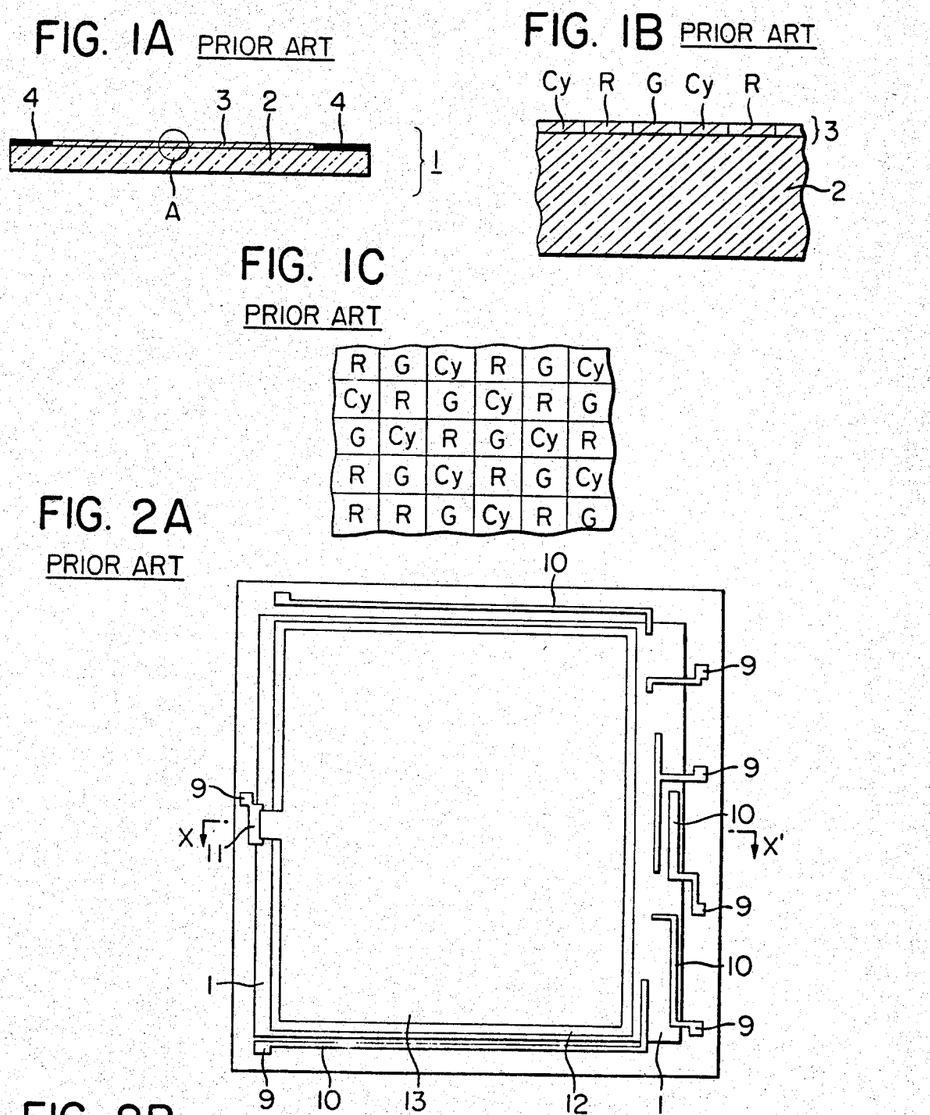
FIG. 1A is a sectional view of a prior art color filter.
FIG. 1B is a fragmentary sectional view, on enlarged scale, of an area indicated by a circle A in FIG. 1A.
FIG. 1C is a fragmentary top view thereof.
FIGS. 2A and 2B are views used for the explanation of bonding a color filter to a color-image sensor chip with a conventional adhesive which is curable by ultraviolet-ray irradiation, FIG. 2A being a top view and FIG. 2B being a sectional view taken along the line X—X' of FIG. 2A.
Figure 2B:
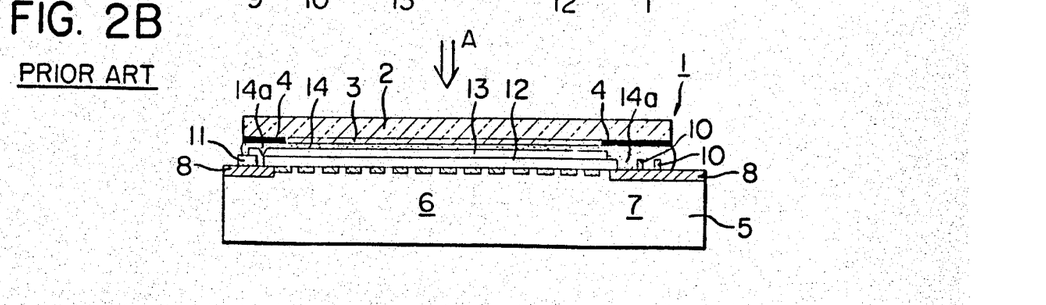
Figure 3:
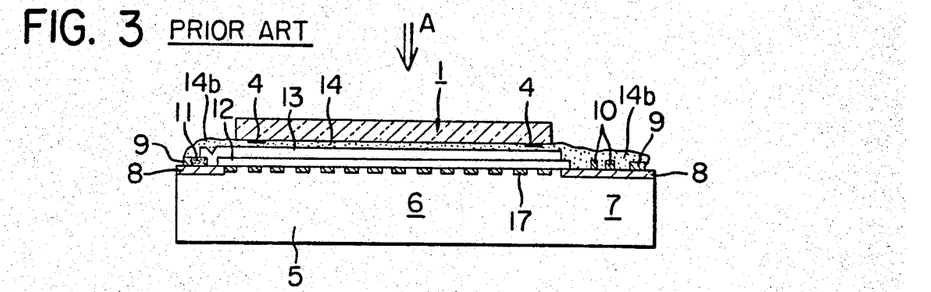
FIG. 3 is a view used for the explanation of an adhesive which is squeezed out when a color filter is pressed against a color-image sensor chip.

FIGS. 1 through 3

As shown in FIGS. 1A through 1C, a prior art color filter 1 for solid-state color-image sensors comprises, in general, an optical glass substrate 2 and a three-color mosaic or stripe pattern to be referred to as "a filter pattern" 3. The filter pattern 3 in turn is surrounded by light-shielding regions 4 so that noise may be prevented from being generated in dummy and transfer regions in the picture elements of the color-image sensor. R, Cy and G designate red, cyan blue and green stripes or mosaic elements, respectively.

A most typical example of mounting the color filters 1 of the type described is shown in FIGS. 2A and 2B. That is, a picture-element grid 6 consisting of photodiodes for sensing a focused optical image and charge-coupled elements for transferring optico-electric signals is fabricated over one major surface of a p-type substrate 5. Driving circuits 7 consisting of shift registers or CCD for driving the picture-element grid 6 are arranged around the border of the picture-element grid 6. Insulation layers 8 are formed over the driving circuits 7. Metal layers 10 are extended over the insulation layer 8 for interconnecting the driving circuits 7 and output pads 9 through windows formed through the insulation layer 8. In like manner, a metal layer 11 is extended over the insulation layer 8 for interconnecting between a photoconductive film 12 and an output pad 9. Over the major surface of the picture-element grid 6 is lamination of the photoconductive layer 12 consisting of $ZnSe-Zn_{1-x}Cd_xTe$ or amorphous silicon and a transparent electrode 13. The color filter 1 comprising the glass substrate 2 and the filter pattern 3 as described previously with reference to FIG. 1 is bonded over the transparent electrode 13 with an adhesive 14 in such a way that the color stripes or mosaic elements of the filter pattern 3 may be correctly registered with individual picture elements of the picture-element grid 6.

When the adhesive 14 is of the ultraviolet ray sensitive type, ultraviolet rays are irradiated in the direction indicated by an arrow A in FIG. 2B so that the adhesive agent 14 may be cured.

However, the prior art color filter 1 has the light-shielding regions 4 are described previously, so that no ultraviolet ray is permitted to transmit therethrough and consequently the adhesive 14 immediately below the light-shielding regions or layers 4 remains uncured as indicated by 14a in FIG. 2B.

In addition, the filter pattern 3 has a relatively low transmission coefficient of the order of a few percent to the ultraviolet rays ranging from 200 to 400 nm in wavelength. As a result, it is also difficult to cure the adhesive 14 immediately below the color filter 1. As a principle, when the intensity of ultraviolet rays is increased, curing will result even though the color filter 1 has a low transmission coefficient of the order of a few percent, but there is a fear that since the filter pattern 3 is made of organic compounds when it is subjected to an intensive irradiation of ultraviolet rays, excessive degradation of the organic compounds will result so that the color filter 1 cannot be used in practice.

When the ultraviolet-ray curable adhesive 14 is used for bonding the color filter 1, it very frequently spreads out of the color filter 1, thereby covering the output pads 9 as shown in FIG. 3. Therefore, when the color-image sensor subassembly is subjected to the ultraviolet rays, the adhesive 14 over the input and output pads 9 is also cured, so that no fine lead wires can be bonded to them in a packaging step.

One of the remedies is to remove the adhesive 14 which has been spread or squeezed out of the color filter 1 by means of a suitable organic solvent. However, the organic solvent tends to penetrate into the adhesive layer between the color filter 1 and the transparent electrode 13, thus leaving adverse effects to the secure bonding between them. Thus, it is impossible to remove only the adhesive covering the input and output pads 9.

Another remedy is to shield the input and output pads with a suitable optical shielding means when the chip is subjected to the curing step and thereafter to remove the adhesive on the input and output pads 9 with a suitable organic solvent. However, it is very difficult to carry out this remedy in practice because the shielding mask must be registered with the chip within a tolerance of plus or minus hundreds microns and because of the defraction problem of ultraviolet rays.

The prior art solid-state color-image sensors have further drawback resulting from the fact that the surfaces of the color filter 1 and the chip are very soft, so that they are easily damaged by rough handling. The chance of their surfaces being damaged is high especially when the substrate or wafer is sectioned into individual tips or dies. Furthermore, resistance-to-heat and resistance-to-chemical of the color filter 1 are low, so that it had been difficult to clean it sufficiently. As a result of the surface flaws, the yield of the prior art solid-state color-image sensors had been low. Thus, elimination or reduction of surface flaws to a minimum had been the most difficult problem to be left unsolved in the production of the solid-state color-image sensors.

DESCRIPTION OF THE PREFERRED EMBODIMENTS

First Embodiment

Figure 4A:
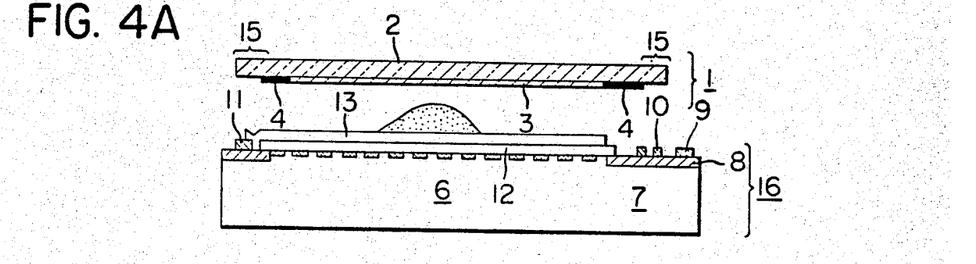
FIGS. 4A and 4B are sectional views used for the explanation of bonding a color filter to a color-image sensor chip according to the present invention.
Figure 4B:
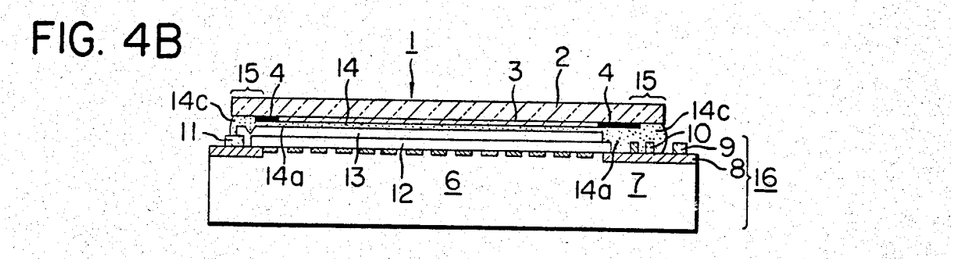

As shown in FIG. 4A, an adhesive such as a thiol-ene series adhesive which is thermally curable and ultraviolet-ray curable is applied over the surface of the transparent electrode 13. The adhesive may be prepared by adding 1 to 3% of a thermosetting initiating agent such as benzopinacole or its derivatives or azobis-iso-butyronitrile or its derivatives or their mixtures to a compound such as a product or Norland Co. and sold under trademark of NOA-61 or a product of W. R. Grace Corp. and sold under a trademark of RCP-611u. "NOA-61" or "RCP-611u" are thiol-ene resins. At the presence of the initiator, radicals are produced and thermosetting proceeds. In this case, an ultraviolet-ray curing initiator (such as benzophenone which produces radicals when irradiated with radiation of the wavelengths of about 370 nm) will not react with the thermosetting initiator. That is, a thiol-ene series resin added with 1 to 2% of benzophenone and benzopinacole is both ultraviolet-ray curable and thermally curable. More specifically, "NOA-61" added with 2% of benzopinacole can be cured when heated at 80° C. for about 20 minutes. "NOA-61" added with 1 to 2% of azobis-iso-butyronitrile (when the contents is higher than 2%, bubbles are produced) can be cured at 60° C. for about 20 minutes. Both the adhesives can be cured when irradiated with a high-pressure mercury-vapor lamp. Thereafter, the color filter 1 is overlaid in such a way that its filter pattern 3 is made into contact with the adhesive 14 and pressed against it so that excessive adhesive and bubbles can be squeezed out. Next, while the color filter 1 and the chip 16 are pressed against each other, the filter pattern 3 is made into alignment with the individual picture elements of the picture-element grid 6 and then the chip 16 with the color filter 1 is irradiated for about 30 seconds at an intensity of 100 m W.S./cm² with a high-pressure mercury-vapor lamp. As a result, the adhesive 14c sandwiched between the transparent peripheral portions 15 of the color filter 1 and the chip 16 can be cured. In this step it is preferable that the adhesive 14 immediately below the filter pattern 3 is optically shielded or masked. Next, the adhesive squeezed out around the periphery of the color filter 1 is removed with a suitable organic solvent so as to clean and expose the bonding pads 9. Thereafter, the substrate is thermally cured for about 30 minutes in an oven maintained at temperatures between 60° C. and 80° C. During this step, the adhesive 14 which has not been completely cured by the irradiation of ultraviolet rays; that is, the adhesive immediately below the filter pattern 3 and the light-shielding portions 4 of the color filter 1, can be completely cured. Thus, the color filter 1 is completely and securely bonded to the chip 16 as shown in FIG. 4B.

According to the results of the experiments conducted by the inventors, it was found out if an ultraviolet-ray irradiation time interval is so short that the color compounds of the mosaic or stripe pattern 3 will not be adversely affected, the curing may be accomplished by irradiating the ultraviolet rays over the whole surface of the color filter 1.

According to the first embodiment, after the color filter 1 has been secured to the chip 16 in such a way that no misregistration will result between them, the chip 16 with the color filter 1 is subjected first the curing step with the irradiation of ultraviolet rays and then the thermal curing step so that the adhesive 14 can be completely cured. Thus, a time interval required for attaining the correct alignment or registration between the color filter 1 and the chip 16 can be considerably shortened.

In addition, even when the color filter 1 includes the light-shielding portions or light guards 4, it can be securely bonded to the chip 16 by the irradiation of ultraviolet rays and heating without causing any degradation of the color compounds of pigments in the color filter 1.

As a result, a higher degree of reliability in bonding between the color filter 1 and the chip 16 can be ensured. Furthermore, the mass production of the solid-state color-image sensors can be much facilitated. Thus, the present invention has a high industrial value.

Second Embodiment

The light-curing initiators used in the present invention includes benzophenone, thioxanthone and benzanthrone and the thermal curing initiators used in the present invention include radial initiators such as benzopinacole. A curing time or rate of an ultraviolet-ray and thermally-curable adhesive such as a thiol-ene series adhesive such as "NOA-61 or RCP-611u" described previously is dependent of the concentration of a radial initiator. However, when such adhesive is exposed to the oxygen, rapid decrease in radicals results, so that curing will not proceed. For instance, curing proceeds in the following steps:

Initiation of curing:

Chain reactions:

Termination of reactions:

When the initiator is benzophenone and the reactions or curing is carried out in the oxygen atmosphere, radicals vanish in the following steps:

That is, the radicals produced when irradiated with radiation are rapidly vanishing so that curing will not proceed.

Therefore, when the step for bonding the color filter 1 to the chip 16 is carried out in the oxygen atmosphere with an ultraviolet-ray curable adhesive whose curing proceeds at the presence of a radial initiator, the adhesive 14a which is squeezed out of the color filter 1 as shown in FIG. 3 can be prevented from being cured and the adhesive 14 which is sandwiched between the color filter 1 and the picture-element grid 6 or more particularly the transparent electrode 13 can be prevented from being exposed to the surrounding atmosphere. As a result, curing proceeds quickly. After the adhesive 14 sandwiched between the color filter 1 and the chip 16 has been cured, the adhesive 14a which is squeezed out and remains uncured can be selectively removed with a suitable organic solvent.

Strictly speaking, the oxygen is not sufficiently diffused into the adhesive 14a which is squeezed so that curing proceeds to some extent within the adhesive 14a. However, in practice the adhesive 14 sandwiched between the color filter 1 and the chip 16 is about 10 μm in thickness while the squeezed-out adhesive 14a is hundreds microns which is by far thicker than the adhesive layer 14. Thus only the sandwiched adhesive layer 14 can be completely cured without curing the interior of the squeezed adhesive 14a by suitably controlling the irradiation intensity and time interval.

For instance, the adhesive or "NOA-61" layer 14 which is sandwiched between the color filter 1 and the chip 16 and which is about 10 μm in thickness can be completely cured in the atmosphere containing about 20% of the oxygen by the irradiation of ultraviolet rays at the intensity of 58 m W.S./cm² with a high-pressure mercury-vapor lamp. Thereafter, the squeezed-out adhesive 14a can be selectively removed completely with an organic solvent.

Since a thermosetting initiator such as benzopinacole is added, the squeezed-out adhesive 14a whose interior remains uncured can be completely cured by heating.

In summary, according to the third embodiment, only the adhesive layer 14 sandwiched between the color filter 1 and the chip 16 can be cured by the first step of bonding the color filter 1 to the chip 16 while the squeezed-out adhesive 14a which covers the bonding pads 9 remains uncured. As a result, the squeezed-out adhesive 14a can be easily removed with a suitable organic solvent and consequently the step for bonding fine lead wires to the input and output pads 9 can be much facilitated. Thus, the assembly costs of the solid-state color-image sensors can be considerably reduced.

Third Embodiment

Figure 5:
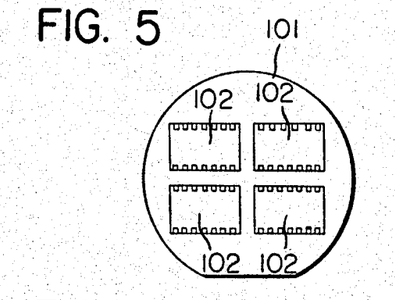
FIG. 5 is a top view of a semiconductor wafer upon which are fabricated a plurality of solid-state color-image sensor elements to be divided into individual chips.

As shown in FIG. 5, a plurality (four in FIG. 5) of solid-state color-image-sensor elements or chips 102 are fabricated over the surface of a silicon wafer 101.

Figure 6:
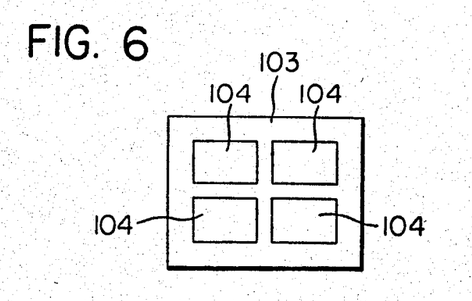
FIG. 6 is a top view of an optical glass substrate or wafer upon which are printed or otherwise formed a plurality of color filters to be divided into individual ones.

As shown in FIG. 6, a plurality (four) of color filters 104 are formed on an optical glass substrate 103.

These wafer 101 and substrate 103 are preferably fabricated by a contamination-free process and then coated with protective films or layers immediately after the chips 102 and the color filters 104 have been fabricated. According to the third embodiment, therefore, the chips 102 and the color filters 104 are coated by the spin-coating process with an ultraviolet-ray-curable resin such as "OPL 7", a trademark of product of W. R. Grace Corp., which is low in viscosity and then is irradiated with the ultraviolet rays so that uniform protective layers may be formed. The ultraviolet-ray-curable resins used for forming such protective layers preferably have the following properties:

(i) Viscosity lower than 500 cps in order to obtain a uniform thickness of about 2 μm of the protective layers.

(ii) They have a uniform and preferably high transmission coefficient for the visible rays.

(iii) They preferably exhibit a higher degree of sensitivity so that they can be cured with a small quantity of ultraviolet radiation in order to prevent the degradation or changes in characteristics of the color filter due to an excessive irradiation.

However, it should be remembered that the bonding pads on the chips 102 must not be coated with the protective layers. A process for removing undesired protective layers over the bonding pads has been well known in the art, but according to the present invention, the ultraviolet-ray-curable resins are used so that a proximity printing with a noncontact mask may be used in a curing step with the ultraviolet radiation and consequently the resin layers on the bonding pads remain uncured and can be removed with a suitable solvent.

Figure 7:
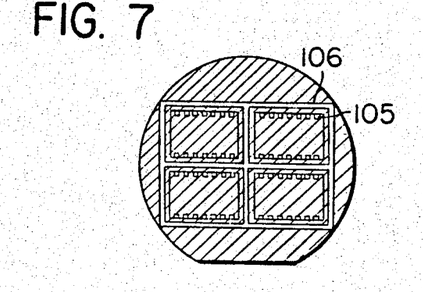
FIG. 7 and FIG. 8 show the wafer and the optical glass substrate or wafer shown in FIGS. 5 and 6, respectively, and covered with protective layers.
Figure 8:
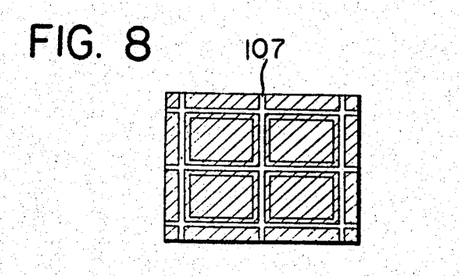

The experiments conducted by the inventors showed that the protective layers or coatings tend to be separated from the chips 102 and the color filters 104 are sectioned with a grinding wheel. As a result, the succeeding steps are adversely affected. Therefore, it is preferable that, as shown in FIGS. 7 and 8, isolation lines 106 and 107 are masked in the step for irradiating the ultraviolet rays, so that the protective layers along the isolation lines 106 and 107 remain uncured and subsequently can be removed with a suitable organic solvent. In FIGS. 7 and 8, the protective layers are hatched and the isolation lines 106 and 107 are not covered with the protective layers.

The wafer 102 and the optical glass substrate 103 are sectioned along the axes of the isolation lines 106 and 107 with a grinding wheel which is spinning at a high speed. That is, after the grinding wheel has cut relatively deep grooves along the isolation lines 106 and 107, the wafer 101 and the optical glass substrate 103 can be sectioned or fractured along the the scribe lines into individual chips. In the latter case, a diamond-tipped scribe, a diamond-edged saw or a laser scriber can be used.

Figure 9:
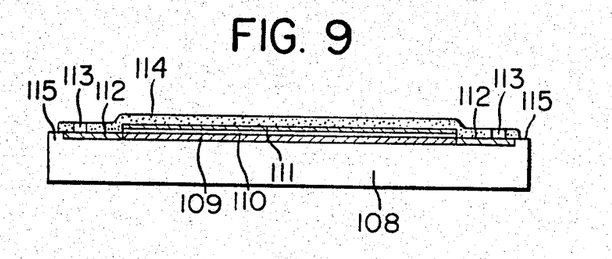
FIG. 9 is a sectional view of a solid-state color-image sensor chip.

FIG. 9 shows in section a sectioned chip bearing a solid-state color-image sensor comprising a silicon substrate 108, a picture-element grid 109, a photoconductive layer 117, a transparent electrode 111 and a driving circuit 112. The transparent electrode 11 is coated with a protective coating 114. A mask was so placed in the step for irradiating ultraviolet radiation that bonding pads 113 and the peripheral portions 105 of the silicon substrate 108 are not covered with protective layers.

Figure 10:
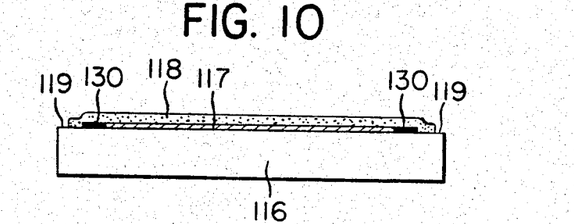
FIG. 10 is a sectional view of a color filter.

FIG. 10 shows in section a sectioned color filter chip comprising an optical glass substrate 116, a three-color filter pattern 117 and a protective coating 118. The peripheral portions 119 of the substrate 116 are not covered with protective layers.

When the wafers or optical glass substrates of the types described are sectioned or divided into individual chips, the latter tend to be contaminated with chips or particles and cooling liquids. However, according to the present invention, the optical filter is covered with the protective coating 118, so that after the sectioning or dividing step, it may be subjected to a cleaning step and consequently may be completely from contaminants. Thus, as compared with the prior art fabrication processes which provide no protective coating, the present invention can attain a high yield.

Figure 11:
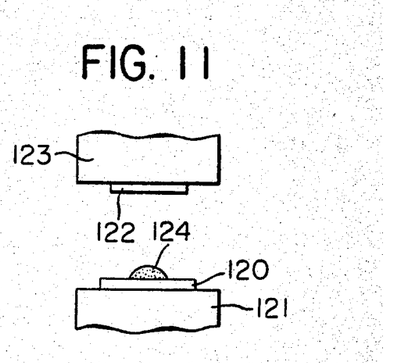
FIGS. 11 and 12 are views used for the explanation of a sequence for filling an adhesive between a color filter and a solid-state color-image sensor chip.

After the sectioning or dividing step, the solid-state color-image sensor chip 120 is mounted on a lower stage 121 while the optical or color filter chip 122 is mounted on an upper stage 123. The upper and lower stages 123 and 122 are so aligned that the centers of the chips 120 and 122 are registered. The color filter chip 122 must be securely held in position by a vacuum suction holding means or the like. On the other hand, the color-image sensor chip 120 may be merely placed on the lower stage 121 or more preferably it is securely held in position also by a vacuum suction holding means or the like.

After the chips 120 and 122 have been securely held in position in the manner described above, a suitable amount of an adhesive 124, which is curable not only by the ultraviolet-ray irradiation but also by heating, is dropped at the center of the color-image sensor chip 120 by means of a suitable dispenser means which is commercially available and is capable of dispensing a predetermined amount of adhesive. The adhesive 124 preferably assumes a liquid drop due to its surface tension. In addition, the adhesive 124 exhibits the same optical properties when cured as the protective layer. Especially the closer the refractive index of the adhesive 124 is to that of the protective layer, the more satisfactory results can be obtained.

Figure 12:
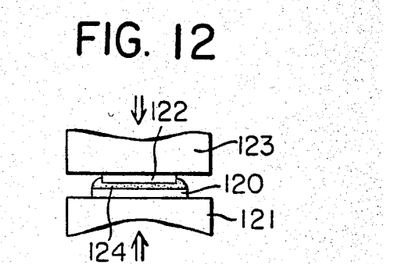

Next, the upper and lower stages 123 and 121 are moved toward each other while their opposing surfaces are maintained in parallel with each other, so that the adhesive 124 may be spread over the surface of the color-image sensor chip 120 and subsequently be uniformly filled between the chips 120 and 122 as best shown in FIG. 12. As the chips 120 and 122 are moved toward each other, first the center portions thereof are made into contact with each other and then the contact interface is gradually spreading outwardly so that no bubble will be trapped between them. Thus, according to this embodiment, it is not needed to make the upper and lower stages 123 and 121 press against each other under a high pressure, but the adhesive 124 can be uniformly spreaded or distributed between the chips 120 and 122 without trapping any bubble.

Next, the color filter chip 122 is released from the upper stage 123 and then the upper stage 123 is retracted upward.

Figure 13:
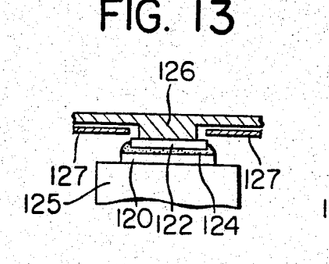
FIG. 13 is a view for the explanation of an alignment-and-bonding step.

The correct registration between the color filter chip 122 and the color-image sensor chip 120 can be attained by displacing them relative to each other. According to the embodiment, the color filter chip 122 is held stationary while the color-image sensor chip 120 is displaced relative to the chip as will be described in detail below. That is, as the lower stage 121 is displaced, the color-image sensor chip 120 preferably is securely held in position by means of a vacuum suction clamping device or the like as described previously. When the lower stage 121 is not displaced for alignment, the chip assembly; that is, the chips 120 and 122 with the adhesive 124 sandwiched between them is transferred to an alignment stage 125 and securely held in position by a vacuum suction clamping means or the like as shown in FIG. 13. A pressure plate 126 exerts a suitable pressure on the upper surface of the color filter chip 122. Since the color filter chip 122 must be held stationary during the alignment step, a vacuum suction clamping means or the like may be used, but when the pressure plate 126 is pressed against the upper surface of the color filter chip 122 in such a way that they are made into high frictional engagement as shown in FIG. 13, the adhesive 124 serves as a lubricant, so that the color-image sensor chip 120 can be displaced with the color filter chip 122 which is held stationary. Therefore, it is preferable that the contact surface of the pressure plate 126 is partially or wholly coated with a thin viscous film.

The pressure plate 126 is partially or wholly made transparent to the visible light range as well as the range of wavelengths which are absorbed by the adhesive 124 which in turn is curable by the ultraviolet irradiaton. An operator observes through a microscope above the pressure plate 126 so as to attain the correct alignment or registration between the color filter chip 122 and the color-image sensor chip 120. To put into another way, the alignment is attained by observing the alignments marks on the chips 120 and 122 and aligning them so that the pressure plate 126 must be provided a transparent window through which operator can observe the alignment marks.

During the alignment step, the pressure plate 126 must be pressed against the color filter chip 122 and hence against the solid-state color-image sensor chip 120 under a suitable pressure. If the adhesive layer 124 between them can be maintained sufficiently thin less than 10 μm and when the ultraviolet rays are irradiated from the above, they are transmitted through the pressure plate 126, which is partially or wholly transparent as described previously, to the adhesive layer 124, so that the latter is partially or wholly cured and consequently the chips 120 and 122 are partially or wholly bonded together. When the thickness of the adhesive layer 124 cannot be made sufficiently thin, it suffices merely to increasing the exerting pressure of the pressure plate 126.

As described many times previously, the adhesive squeezed out of the space between the chips 120 and 122 most frequently tends to cover the bonding pads during the curing step with the ultraviolet irradiation so that the squeezed-out adhesive is cured. As a result, the adhesive cured on the bonding pads must be removed. One of the remedies for this problem has been already described in conjunction with the second embodiment, but according to the third embodiment a mask 127 is provided so as to shield the bonding pads and subsequently to prevent the adhesive on them can be prevented from being cured.

During the ultraviolet irradiation step following the alignment step, at least one portion of the adhesive layer 124 is cured so that the chips 120 and 122 are partially bonded to each other as described previously. Therefore, the bonded chips 120 and 122, which are now a unitary construction, are removed out of the alignment device, so that in the subsequent steps, the undesired adhesive on for instance bonding pads is removed with a suitable organic solvent and then the adhesive which remains uncured can be curend by heating.

Figure 14:
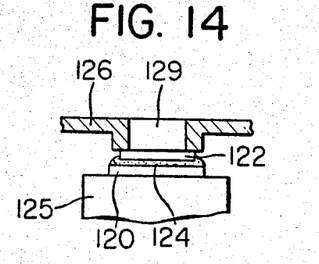
FIG. 14 is a view used for the explanation of another alignment-and-bonding step.

In FIG. 14 is shown another step for aligning the chips 120 and 122 and irradiating the adhesive 124 with the ultraviolet rays. A pressure plate 128 is formed with a pressure pad which is extended downward and which has a through opening 129. Therefore, the pressure pad presses only the peripheral portions of the color filter chip 122 and the ultraviolet rays are irradiated through the through opening 129.

In general, because of the difference in coefficient of thermal expansion of the optical glass substrate from that of the film pattern of the color filter chip 122, the film pattern side which is made into contact with the color-image sensor chip 120 is convex downward. Similarly, the upper surface of the color-image sensor chip 120 is convex upward because of the formation of an oxide film or the like. Therefore, when the chips 120 and 122 are pressed against each other, their convex surfaces are flattened while the adhesive 124 between them is uniformly thinned in a simple manner.

The second embodiment may be used, but according to the third embodiment the bonding pads and the areas adjacent to them are not irradiated with the ultraviolet rays, so that the adhesive which remains uncured thereover can be removed with a suitable organic solvent. Thereafter, the adhesive 130a which remains uncured below the light-shielding portions or optical guard bands 131 can be completely cured by heating.

Figure 15:
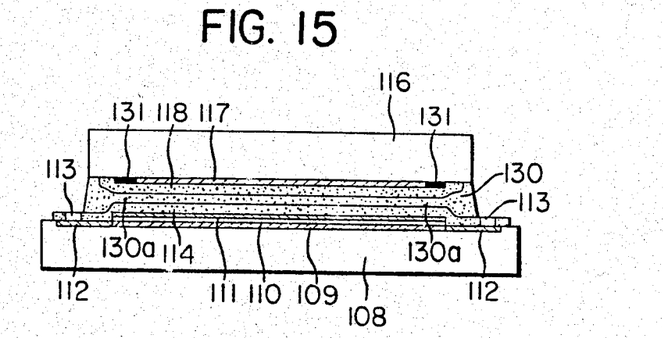
FIG. 15 is a sectional view of a solid-state color-image sensor chip with a cemented color filter.

In FIG. 15 is shown in section a finished solid-state color-image sensor. Reference numerals used in FIGS. 9 and 10 are also used here to designate similar parts. The solid-state color-image sensor chips and the color filter chips shown in FIGS. 9 and 10 are bonded together with an adhesive 130. The overall thickness of the protective coatings 114 and 118 and the adhesive layer 130 is less than 10 μm. They can be so easily controlled that, for instance, the protective coatings 114 and 118 have a thickness of 2 μm while the adhesive layer 130 has a thickness of 5 μm. Reference numeral 131 designates a light-shielding layer.

According to this embodiment, it becomes very simple to attain optical matchings between the protective coatings which cover the surfaces of the image sensor chip and the color filter chip and which are cured with the ultraviolet ray irradiation and the adhesive layer between these chips which is also cured with the ultraviolet ray irradiation. As a result, the reflections due to the difference in refractive index can be eliminated and the optical transmissions losses can be reduced to a minimum.

According to the third embodiment, the yield can be remarkably improved and the number of fabrication steps can be reduced to a minimum because an adhesive can be cured by irradiation with ultraviolet rays for a short time interval and then by heating.

The third embodiment will contribute greatly to the reduction in size and cost and improvement of performance of the solid-state color-image sensors.

Fourth Embodiment

Figure 16:
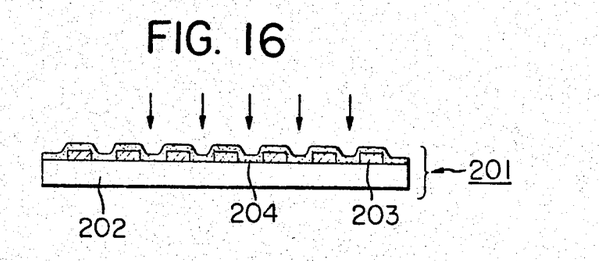
FIG. 16 is a sectional view of a color filter for a single-plate color-image sensor.

In the third embodiment the color filter has been described as being covered with the protective layer or film. In the fourth embodiment, as shown in FIG. 16, a protective resin layer 204 consisting of polymethyl methacrylate or polyurethane plastic and formed over a filter pattern 203 is removed by a predetermined amount by a sputtering process.

Figure 17A:
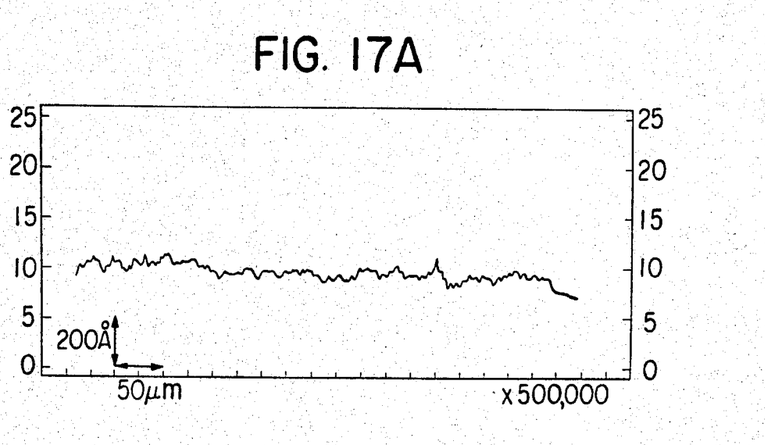
FIG. 17A shows surface roughness of a color filter of the present invention prior to be subjected to a sputtering treatment.
Figure 17B:
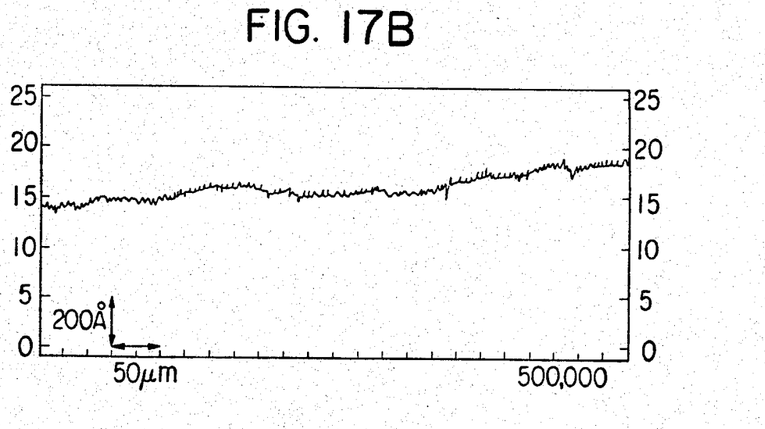
FIG. 17B shows surface roughness after the sputtering treatment.
Figure 18A:
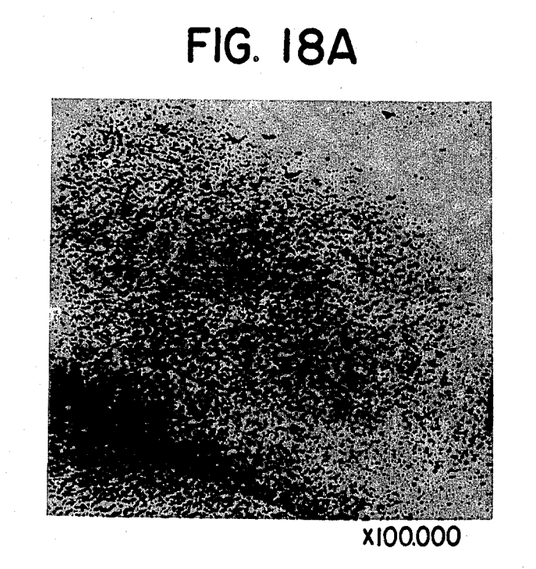
FIG. 18A is a photo showing the surface of a color filter prior to a sputtering treatment.
Figure 18B:
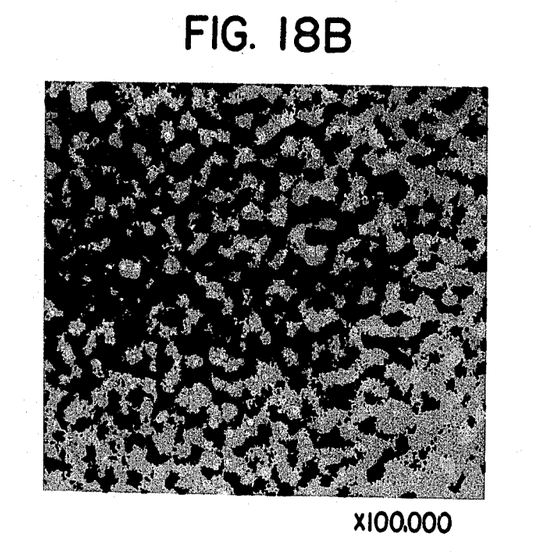
FIG. 18B is a photo showing the surface thereof after the sputtering treatment.

The sputtering parameters or conditions:
(1) Atmosphere: contains the $O_2$ gas
(2) Vacuum: 0.15 torr
(3) Excitation potential: 50 W
(4) Excitation time: 2 minutes In FIG. 16, reference numeral 201 designates the whole color filter and 202, a transparent glass substrate. As a result of the sputtering process, surface roughness changes from 3 to 4 nm as shown in FIGS. 17A and 17B. FIGS. 18A and 18B are SEM photos showing the surface of the protective layer prior to and after the sputtering process.

The filter pattern protective layer is initially 200 nm in thickness and is reduced to 150 nm by the sputtering. In practice, under the above-described sputtering conditions, the amount of the protective layer removed is 100 nm in terms of thickness.

In order that the protective layer on each color filter chip may be removed by the same amount, the removal rate must be adjustable within a predetermined range. For this purpose, the excitation potential is set to 50 W. Then the removal rate becomes 50 nm/min.

Figure 19:
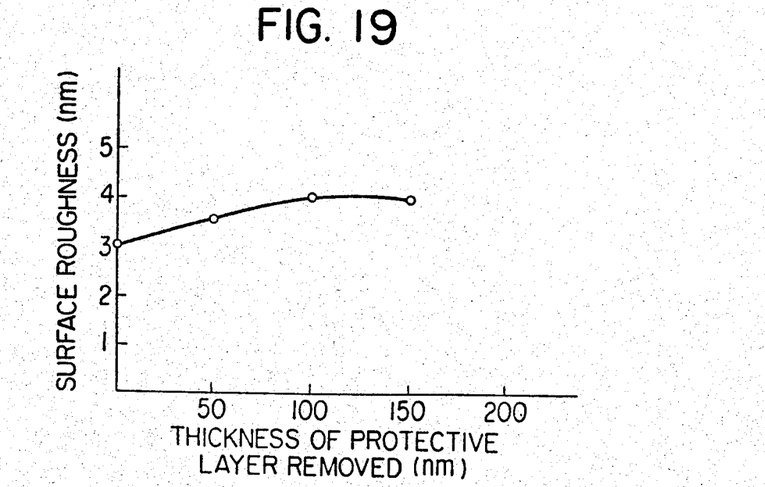
FIG. 19 shows the relationship between the sputtered amount in terms of thickness and the surface roughness.

As shown in FIG. 19, surface roughness remains almost unchanged until the protective layer is removed by the amount of 150 nm in terms of thickness as shown in FIG. 19 and is 4 nm at the maximum. The transmission coefficient was measured with a spectrometer but no significant change was observed. In other words, even when surface roughness changes from 3 to 4 nm, no adverse effect will result.

The characteristics of the color filter will not be adversely affected.

Figure 20:
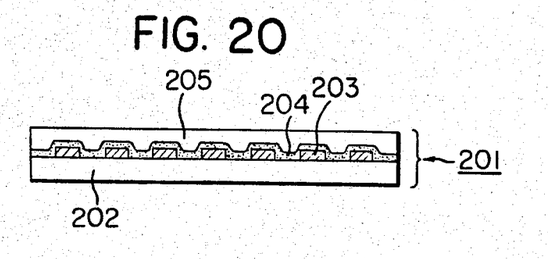
FIG. 20 is a sectional view of a color filter covered with a protective layer in accordance with the present invention.

As shown in FIG. 20, an ultraviolet-ray-curable resin (such as a thiol-ene series resin which is a product of W. R. Grace Corp. sold under a trademark of "OPL 7") is applied to a thickness of 2.5 μm over the surface of the color filter 210, which has been sputtered as described previously, and cured to form a protective layer 205. The color filter 201 is then cleaned with an ultrasonic cleaning device with an output of 150 W, but no separation is observed.

When the prior art color filters are cleaned by an ultrasonic cleaning device with an output of 100 W, separation results, but no separation will result in the color filter in accordance with the present invention even when the output is increased to 150 W. As a result, the color filter can be thoroughly cleaned in a succeeding step.

According to the fourth embodiment, a higher degree of adhesion strength may be imparted to an optical component without causing its degradation (the decrease in transmission coefficient) when a protective layer is formed over the surface of the optical component.

In addition, resistance-to-cleaning can be improved.

Furthermore, the adhesion strength to an organic compound can be considerably increased.

Fifth Embodiment

Figure 21A:
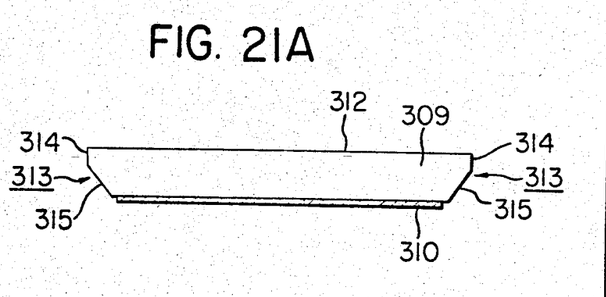
FIG. 21A is a side view of an embodiment of a color filter in accordance with the present invention.
Figure 21B:
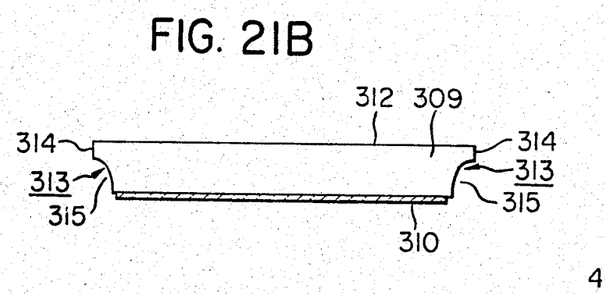
FIG. 21B is a side view of another embodiment thereof.

According to a fifth embodiment of the present invention, the side walls 313 of an optical glass substrate 309 are inclined or curved inwardly as shown in FIG. 21A or FIG. 21B, so that the side edges of a colored pattern layer 310 are located inwardly of those of the upper surface 312 of the substrate 309. However, the upper edge of the tapered, inclined or curved side wall portion 315 must be such that the straight wall portion 314 may be left, the height of the straight wall portion 314 being from 50 to 150 μm when the substrate 309 is 500 μm in thickness. The straight wall portions 314 serves to prevent the edges of the glass substrate 309 from cracking. The tapered, inclined or curved wall portions 313 must be so shaped that an adhesive reservoir 315 capable of holding a suitable amount of adhesive may be formed on each side.

Figure 22:
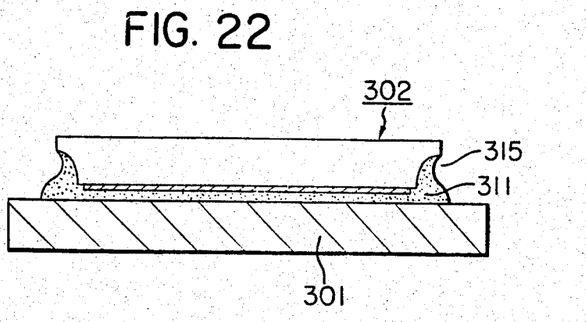
FIG. 22 shows the color filter shown in FIG. 21B which is bonded to a solid-state color-image sensor chip.

The color filter 302 of the type described above is bonded to a solid-state color-image sensor chip 301 as shown in FIG. 22. An adhesive 311 squeezed out between the chip 301 and the color filter 302 is received in the adhesive reservoirs 305, so that it is prevented from being spread over the upper surface of the color filter 302.

So far the substrate of the color filter has been described as comprising an optical glass plate, but it is to be understood that the present invention is not limited thereto and that any optical transparent insulation plates may be used as a substrate.

According to the fifth embodiment, as compared with the conventional color filters, a large amount of adhesive may be applied when the color filter 302 is bonded to the chip 301. In addition, bubbles can be prevented from being trapped between them. Furthermore, the side edge portions of the color filter 302 can be bonded to the chip 301 with a large amount of adhesive 311, so that a higher degree of adhesive strength can be ensured. Thus, the bonding step can be simplified and yet a high yield and a higher degree of reliability in adhesive strength can be ensured.

Figure 23A:
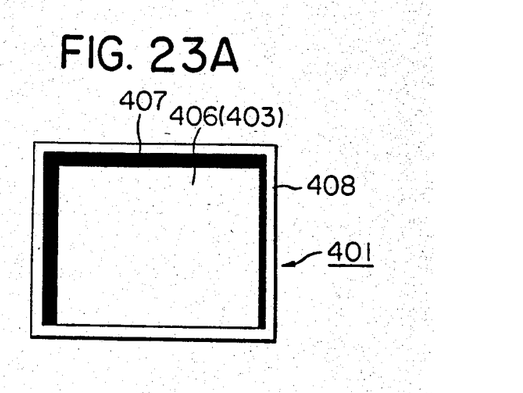
FIG. 23A is a top view of a further embodiment of a color filter in accordance with the present invention.
Figure 23B:
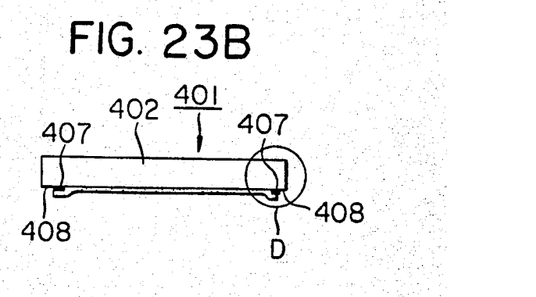
FIG. 23B is a sectional view thereof.
Figure 23C:
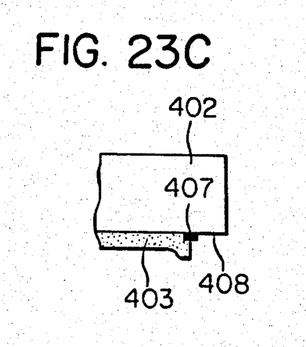
FIG. 23C is a view showing on enlarged scale a portion encircled by a circle D in FIG. 23B.

Sixth Embodiment, FIG. 23

According to the sixth embodiment of the present invention, the peripheral portion 408 which surrounds a light-shielding layer or a light guard band 407 and a colored pattern layer 406 is transparent or not colored so that the ultraviolet rays may be transmitted through the transparent peripheral portion 408 almost without losses. As a result, the color filter 401 can be bonded to a chip by the ultraviolet-ray irradiation with such a dose that the colored pattern layer 406 will not be adversely affected. In addition, an adhesive squeezed out from the space between the color filter 401 and a chip can be easily removed.

If the dose of ultraviolet irradiation is not sufficient enough to cause the complete cure of the adhesive immediately below the colored pattern layer 406, in addition to an ultraviolet-ray-curing initiator, a suitable thermosetting initiator may be added to the adhesive as described previously in conjunction with the first embodiment. Then, after removing the squeezed-out adhesive with a suitable organic solvent, the adhesive can be completely cured by heating. The degradation of the colored pattern layer 406 can be avoided during the heat curing step. (See Japanese Patent Application No. 4857/1980)

The color filter in accordance with the sixth embodiment can be fabricated in a very simple manner by masking the peripheral portion 408 in a step for forming the colored pattern layer 406 by a conventional lithographic technique.

The color filter of the sixth embodiment can be bonded to the solid-state color-image sensor chip with an adhesive which is curable not only by the ultraviolet-ray irradiation but by heating as described previously. As a result, the following effects, features and advantages can be attained:

(1) An adhesive can be cured with such a dose of ultraviolet radiation that a colored pattern layer or a filter pattern will not be degraded in color, to such an extent that a sample can be taken out of a bonding device without causing the separation between a color filter and a color-image sensor chip.

(2) Since the adhesive immediately below the peripheral portion 408 is completely cured by the ultraviolet-ray irradiation, the intrusion of an organic solvent into the adhesive layer between the color filter and the chip can be prevented when the squeezed-out adhesive is removed.

(3) A curing time by ultraviolet-ray irradiation is very short (from 10 to 30 seconds) so that higher productivity can be ensured.

So far the present invention has been described in connection with a single-plate solid-state color-image sensor, but it is to be understood that the present invention may be equally applied to a two- or three-plate type solid-state image sensor.

What is claimed is:

1. A solid-state color-image sensor comprising a color filter and a solid-state image sensor chip bonded together with an adhesive which is curable by ultraviolet-ray irradiation and by heating, said color filter having portions opaque to ultraviolet rays and other portions which transmit such rays.

2. A solid-state color-image sensor as set forth in claim 1, wherein said adhesive contains initiators of radical reaction type which initiate curing by ultraviolet ray irradiation and by heating, respectively.

3. A solid-state color-image sensor as set forth in claim 1, wherein the adhesive immediately below at least a portion of said color filter which is opaque to ultraviolet rays is a heat cured adhesive.

4. A solid-state color-image sensor as set forth in claim 1, wherein said color filter has a colored pattern layer at least partially surrounded with at least one layer opaque to ultraviolet rays.

5. A solid-state color-image sensor as set forth in claim 1, wherein said adhesive is a thiol-ene resin.

6. A solid-state color-image sensor comprising:

a solid-state image sensor chip having a picture-element grid thereon;

a color filter comprising a glass substrate having a filter pattern thereon defining regions optically transparent and opaque to various colors, at least one of said regions being transparent to ultraviolet radiation and at least one other of said regions being opaque to ultraviolet radiation, said filter pattern being in alignment with said picture-element grid; and a layer of a thermally curable and ultraviolet-ray curable adhesive between said sensor chip and said color filter and bonding them together, the region around the edges of said color filter being substantially free of said adhesive, said adhesive including a thermosetting initiating agent and an independent ultraviolet-ray curing initiator, said adhesive layer having an ultraviolet-cured part in alignment with said at least one region transparent to ultraviolet radiation, and a thermally cured part in alignment with said at least one other region opaque to ultraviolet radiation.

7. A solid-state color-image sensor according to claim 6, wherein said adhesive comprises a thiol-ene resin.

8. The solid-state color-image sensor according to claim 7, wherein said thermosetting initiating agent comprises benzopinacole or its derivatives or azobisisobutyronitrile or its derivatives.

9. The solid-state color-image sensor according to claim 7, wherein said ultraviolet-ray curing initiator comprises benzophenone, thioxanthone or benzanthrone.

10. The solid-state color-image sensor according to claim 8, wherein said ultraviolet-ray curing initiator comprises benzophenone, thioxanthone or benzanthrone.

* * * * *